United States Patent
Gong et al.

(10) Patent No.: US 10,418,391 B2
(45) Date of Patent: Sep. 17, 2019

(54) DISPLAY SUBSTRATE, MANUFACTURE METHOD THEREOF, AND DISPLAY DEVICE

(71) Applicants: BOE Technology Group Co., Ltd., Beijing (CN); HEFEI BOE OPTOELECTRONICS TECHNOLOGY CO., LTD., Anhui (CN)

(72) Inventors: Kui Gong, Beijing (CN); Qingli Feng, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/995,691

(22) Filed: Jun. 1, 2018

(65) Prior Publication Data
US 2019/0067337 A1    Feb. 28, 2019

(30) Foreign Application Priority Data
Aug. 30, 2017    (CN) .......................... 2017 1 0765399

(51) Int. Cl.
*H01L 27/14* (2006.01)
*H01L 27/12* (2006.01)
(Continued)

(52) U.S. Cl.
CPC .... *H01L 27/1259* (2013.01); *H01L 29/41733* (2013.01); *H01L 29/7869* (2013.01);
(Continued)

(58) Field of Classification Search
USPC ........................................... 257/72
See application file for complete search history.

(56) References Cited

U.S. PATENT DOCUMENTS

| 6,294,467 B1 * | 9/2001 | Yokoyama | ........ H01L 21/76823 257/E21.584 |
| 2007/0020931 A1 * | 1/2007 | Koura | ............... H01L 21/76831 438/687 |

(Continued)

FOREIGN PATENT DOCUMENTS

| CN | 1918672 A | 2/2007 |
| CN | 101192651 A | 6/2008 |

(Continued)

OTHER PUBLICATIONS

First Office Action, including Search Report, for Chinese Patent Application No. 201710765399.6, dated Jun. 13, 2019, 13 pages.

*Primary Examiner* — Caleb E Henry
(74) *Attorney, Agent, or Firm* — Westman, Champlin & Koehler, P.A.

(57) ABSTRACT

Disclosed are a display substrate, a manufacture method thereof, and a display device. The display substrate comprises: a base substrate, and a metal layer, at least one insulating layer and a metal oxide conducting layer respectively on the base substrate, wherein, the at least one insulating layer is disposed between the metal layer and the metal oxide conducting layer; the metal oxide conducting layer is electrically connected to the metal layer through at least one via hole penetrating the at least one insulating layer; and the metal oxide conducting layer in the at least one via hole comprises metal particles produced by reducing the metal oxide conducting layer.

12 Claims, 7 Drawing Sheets

(51) Int. Cl.
*H01L 29/417* (2006.01)
*H01L 29/786* (2006.01)
*H01L 51/00* (2006.01)
*H01L 51/56* (2006.01)

(52) U.S. Cl.
CPC .......... *H01L 51/0096* (2013.01); *H01L 51/56* (2013.01); *G02F 2201/121* (2013.01); *G02F 2201/123* (2013.01)

(56) References Cited

U.S. PATENT DOCUMENTS

| | | | | |
|---|---|---|---|---|
| 2015/0364500 | A1* | 12/2015 | Cheng | H01L 27/1222 257/59 |
| 2016/0320882 | A1* | 11/2016 | Kim | G06F 3/044 |
| 2018/0122924 | A1* | 5/2018 | Niu | H01L 21/443 |

FOREIGN PATENT DOCUMENTS

| | | |
|---|---|---|
| CN | 102651317 A | 8/2012 |
| EP | 1 724 790 A1 | 11/2006 |
| EP | 1 928 037 A2 | 6/2008 |
| EP | 2 787 527 A1 | 10/2014 |

\* cited by examiner

DISPLAY SUBSTRATE, MANUFACTURE METHOD THEREOF, AND DISPLAY DEVICE

CROSS REFERENCE TO RELATED APPLICATION

The present application claims a priority benefit of Chinese Patent Application No. 201710765399.6, filed on Aug. 30, 2017, the entire contents thereof being incorporated herein by reference.

TECHNICAL FIELD

The present disclosure relates to the technical field of display, and particularly to a display substrate, a manufacture method thereof, and a display device.

BACKGROUND

With development of display technologies, display screens or touch screens have been widely used in people's lives. Among them, liquid crystal displays (LCDs) have characteristics of small volume, low power consumption, no radiation and the like, and are of great significance in the market. Organic light-emitting diodes (OLEDs) have advantages of self-luminescence, rapid response, wide view angle, high luminance, vivid color, light weight and thin thickness, and the like, and also have been widely applied in the market.

SUMMARY

The embodiments of the present disclosure provide a display substrate comprising:
a base substrate, and
a metal layer, at least one insulating layer and a metal oxide conducting layer respectively on the base substrate, wherein,
the at least one insulating layer is disposed between the metal layer and the metal oxide conducting layer;
the metal oxide conducting layer is electrically connected to the metal layer through at least one via hole penetrating the at least one insulating layer; and
the metal oxide conducting layer in the at least one via hole comprises metal particles produced by reducing the metal oxide conducting layer.

In one possible implementation, in the display substrate provided in the embodiments of the present disclosure, the metal particles are present at least on a surface of the metal oxide conducting layer contacting with the metal layer.

In one possible implementation, the display substrate provided in the embodiments of the present disclosure comprises:
a display area, and
a non-display area,
wherein the display area comprises a plurality of thin film transistors.

In one possible implementation, in the display substrate provided in the embodiments of the present disclosure, the display area further comprises an organic film layer on the thin film transistors, a common electrode layer on the organic film layer, and a passivating layer on the common electrode layer; and
the non-display area comprises a plurality of data lines and a passivating layer on the data lines.

In one possible implementation, in the display substrate provided in the embodiments of the present disclosure, the metal layer comprises source/drain electrodes of each of the plurality of thin film transistors;
the metal oxide conducting layer comprises a plurality of pixel electrodes;
the insulating layer comprises the organic film layer and the passivating layer in the display area; and
the at least one via hole comprises a first via hole for conducting each of the plurality of pixel electrodes and corresponding drain electrode.

In one possible implementation, in the display substrate provided in the embodiments of the present disclosure, the metal layer further comprises the plurality of data lines;
the insulating layer further comprises the passivating layer in the non-display area; and
the at least one via hole further comprises a second via hole for conducting each of the plurality of data lines and corresponding pixel electrode.

The embodiments of the present disclosure further provide a display device, comprising the display substrate as described above.

The embodiments of the present disclosure further provide a manufacture method of a display substrate, comprising:
forming a pattern of a metal layer on a base substrate and at least one insulating layer on the metal layer;
etching the at least one insulating layer to form at least one via hole penetrating the at least one insulating layer;
forming a pattern of a metal oxide conducting layer on the at least one insulating layer and in the at least one via hole, wherein the metal oxide conducting layer is electrically connected to the metal layer through the at least one via hole; and
subjecting the metal oxide conducting layer in the at least one via hole to a reducing treatment to produce metal particles in the metal oxide conducting layer in the at least one via hole through reduction.

In one possible implementation, in the manufacture method provided in the embodiments of the present disclosure, said subjecting the metal oxide conducting layer in the at least one via hole to the reducing treatment comprises:
subjecting the metal oxide conducting layer in the at least one via hole to a plasma treatment with a reducing gas.

In one possible implementation, in the manufacture method provided in the embodiments of the present disclosure, the reducing gas comprises:
one or more gases selected from the group consisting of hydrogen, chlorine, carbon monoxide, hydrogen sulfide, hydrogen bromide, methane, and sulfur dioxide.

In one possible implementation, in the manufacture method provided in the embodiments of the present disclosure, said forming the pattern of the metal oxide conducting layer on the at least one insulating layer and in the at least one via hole comprises:
forming a metal oxide conducting layer on the at least one insulating layer and in the at least one via hole, and forming a photoresist layer on the metal oxide conducting layer;
photo-etching the photoresist layer to form a photoresist fully remained area, a photoresist partially remained area and a photoresist fully removed area of the photoresist layer; wherein the photoresist fully remained area corresponds to a portion of the pattern of the metal oxide conducting layer on the at least one insulating layer, the photoresist partially remained area corresponds to a portion of the pattern of the metal oxide conducting layer in the at least one via hole, and the photoresist fully removed area corresponds to an area outside of the pattern of the metal oxide conducting layer; and subjecting the metal oxide conducting layer to an etching treatment.

In one possible implementation, in the manufacture method provided in the embodiments of the present disclosure, said photo-etching the photoresist layer comprises:

photo-etching the photoresist layer with a halftone mask plate or a gray tone mask plate to form the photoresist fully remained area, the photoresist partially remained area and the photoresist fully removed area.

In one possible implementation, in the manufacture method provided in the embodiments of the present disclosure, before said subjecting the metal oxide conducting layer in the at least one via hole to the reducing treatment, the manufacture method further comprises:

removing the photoresist layer in the photoresist partially remained area by an ashing process.

In one possible implementation, in the manufacture method provided in the embodiments of the present disclosure, said removing the photoresist layer in the photoresist partially remained area by the ashing process comprises:

producing a plasma through a plasma process with sulfur hexafluoride and oxygen as working gas, and performing an ashing process to remove the photoresist layer in the photoresist partially remained area.

In one possible implementation, in the manufacture method provided in the embodiments of the present disclosure, said subjecting the metal oxide conducting layer in the at least one via hole to the reducing treatment comprises:

subjecting the metal oxide conducting layer in the at least one via hole to a plasma treatment with one or more gases selected from the group consisting of hydrogen, chlorine, carbon monoxide, hydrogen sulfide, hydrogen bromide, methane, and sulfur dioxide, by using the photoresist fully remained area as a protecting layer.

DETAILED DESCRIPTION

Figure 1:
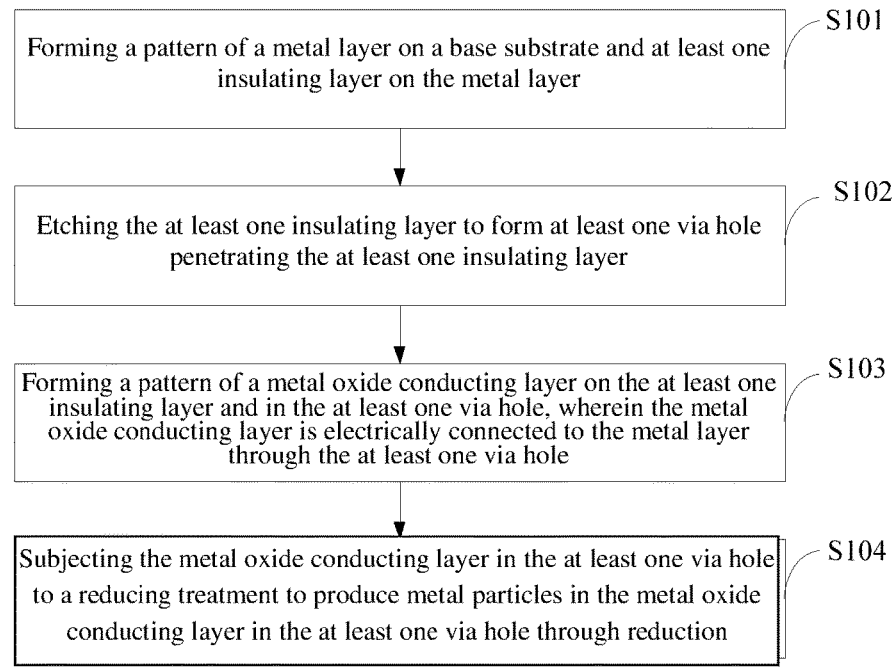
FIG. 1 shows a flow chart of a manufacture method of a display substrate provided in an embodiment of the present disclosure.

The inventors of the present application find that, in relevant OLED technologies, at a contact interface where a metal oxide conducting layer is contacted with a metal layer, a metal oxide in the metal oxide conducting layer is prone to oxidize a metal on the surface of the metal layer, resulting in a relatively high contact impedance, which influences the performances of the display device, for example, it causes a delay in signal transmission, thereby impacting the display image.

For instance, a pixel electrode layer in an array substrate is typically made from indium tin oxide (ITO), a transparent conducting material. The pixel electrode in the pixel electrode layer is connected to a drain electrode of a thin film transistor through a via hole in a display area, while it is connected to a data line through a via hole in a non-display area. At an interface where the pixel electrode is contacted with the drain electrode or the data line, the indium tin oxide is prone to oxidize a metal at the contact interface, resulting in a relatively high contact impedance at the contact interface.

The embodiments of the present disclosure provide a display substrate, a manufacture method thereof, and a display device, which can at least partially solve the above problem of relatively high contact resistance between the metal oxide conducting layer and the metal layer.

Some particular embodiments of the display substrate, the manufacture method thereof, and the display device provided in the present disclosure will be described in detail below with reference to the drawings. The thickness and shape of each film layer in the drawings of the present disclosure do not indicate a real proportion, and are only intended to schematically illustrate the present disclosure.

The embodiments of the present disclosure provide a manufacture method of a display substrate, as shown in FIG. 1, comprising:

S101: forming a pattern of a metal layer on a base substrate and at least one insulating layer on the metal layer;

S102: etching the at least one insulating layer to form at least one via hole penetrating the at least one insulating layer;

S103: forming a pattern of a metal oxide conducting layer on the at least one insulating layer and in the at least one via hole, wherein the metal oxide conducting layer is electrically connected to the metal layer through the at least one via hole; and S104: subjecting the metal oxide conducting layer in the at least one via hole to a reducing treatment to produce metal particles in the metal oxide conducting layer in the at least one via hole through reduction.

Figure 4A:
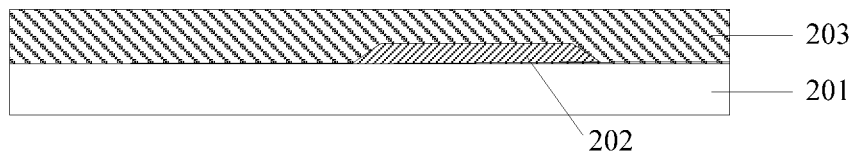
FIGS. 4a to 4h are structural schematic diagrams for respective steps of a manufacture method of a display substrate in an embodiment of the present disclosure.
Figure 4B:
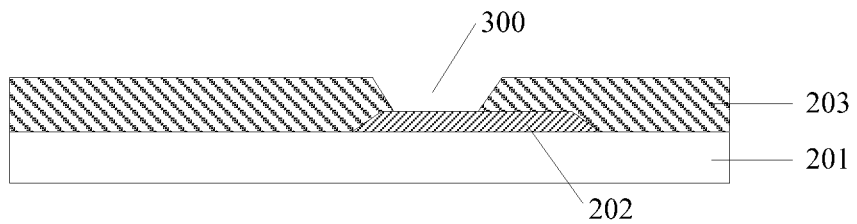
Figure 4C:
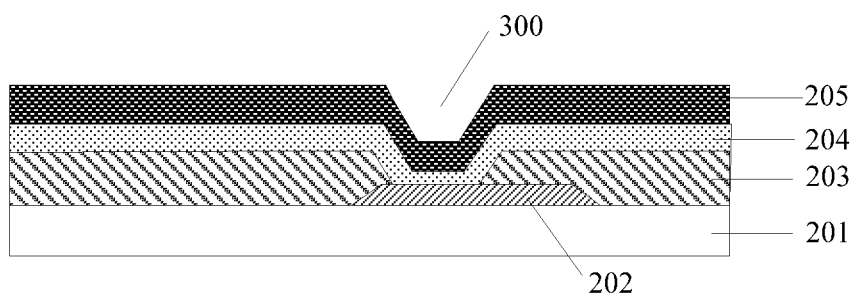
Figure 4D:
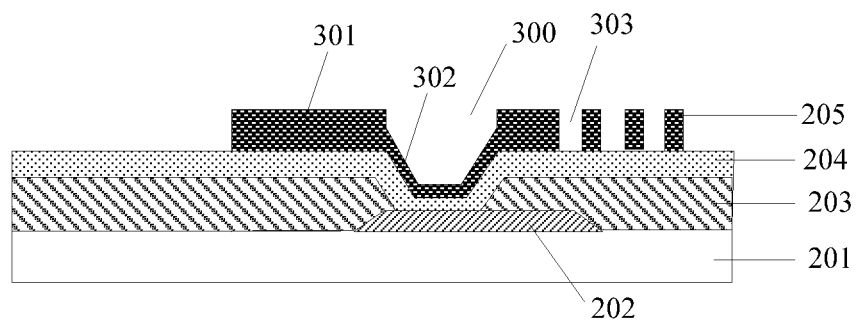
Figure 4E:
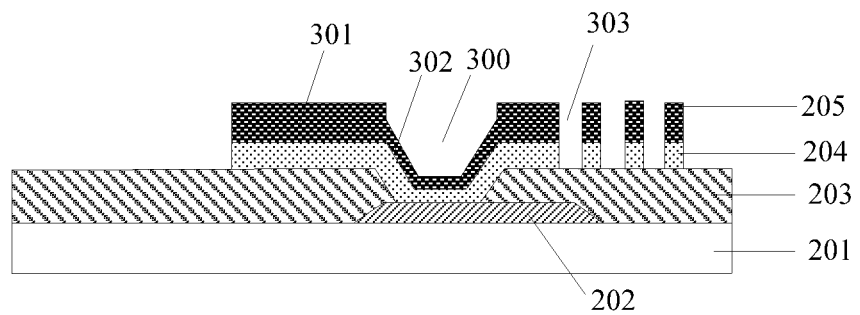
Figure 4F:
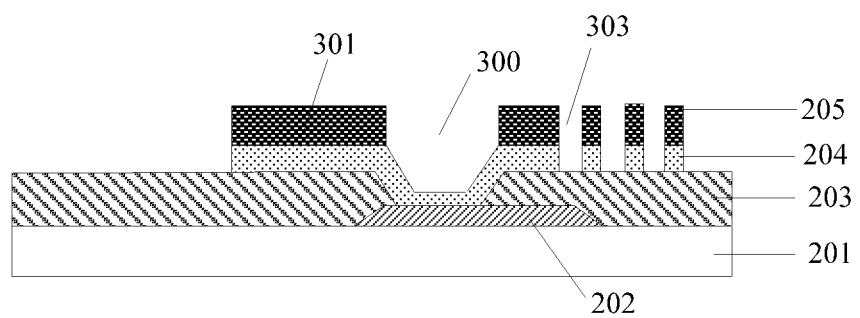
Figure 4G:
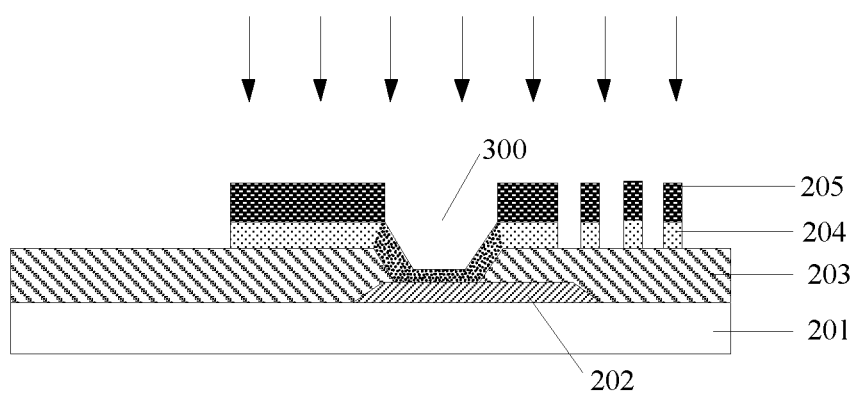

In one optional embodiment, the above manufacture method may particularly comprise:

S101: forming a pattern of a metal layer 202 on a base substrate 201 and at least one insulating layer 203 on the metal layer 202, as shown in FIG. 4a;

S102: etching each insulating layer 203 to form at least one via hole 300 penetrating each insulating layer 203, as shown in FIG. 4b;

S103: forming a pattern of a metal oxide conducting layer 204 on the insulating layer 203 and in each via hole 300, wherein the metal oxide conducting layer 204 is electrically connected to the metal layer 202 through each via hole 300, as shown in FIG. 4e; and S104: subjecting the metal oxide conducting layer 204 in the via hole 300 to a plasma treatment with a reducing gas such that the metal oxide conducting layer 204 is reduced to produce metal particles at least on a surface of the metal oxide conducting layer 204 contacting with the metal layer 202, as shown in FIG. 4g.

In the manufacture method provided in the embodiments of the present disclosure, by subjecting the metal oxide conducting layer 204 in the via hole 300 to a plasma treatment with a reducing gas such that the metal oxide conducting layer 204 is reduced to produce metal particles at least on a surface of the metal oxide conducting layer 204 contacting with the metal layer 202, the conductivity between the metal layer 202 and the metal oxide conducting layer 204 is increased and the contact resistance is reduced, thereby improving the display effect.

In particular implementation, in the above step S101, the material of the metal layer 202 may be a metal material, such as copper, aluminum or the like, but may also be other conducting materials, such as graphene or the like. This is only for illustration, but not intended to limit the material of the metal layer 202. In FIG. 4a, the insulating layer 203 as one layer is illustrated as an example. In particular implementation, the layer number for the insulating layer 203 may be set according to practical requirements, and also an organic material or an inorganic material may be selected to manufacture the insulating layer 203 according to the practical requirements. The layer number and material for the insulating layer 203 are not limited here.

In the above step S102, when it is required to form a plurality of via holes 300, all of via holes penetrating each insulating layer 203 may be formed by one patterning process. The coating and patterning processes for the insulating layer 203 may be low temperature processes, and the temperature range may be controlled between 40° C. to 50° C. in order to avoid that an excessively high temperature influences other film layers.

In the above step S103, the metal oxide conducting layer 204 may be formed by a magnetron sputtering process, and the material of the metal oxide conducting layer 204 may be a transparent material, such as indium tin oxide (ITO), or other materials. The material of the metal oxide conducting layer 204 is not limited here. The metal oxide conducting material may be used as a common electrode layer or a pixel electrode layer, and may form a pattern of the common electrode layer or a pattern of the pixel electrode layer by one patterning process.

In the above step S104, oxygen vacancies in the metal oxide conducting layer 204 can be increased by subjecting the metal oxide conducting layer 204 in the via hole 300 to a plasma treatment with a reducing gas; and it can be controlled such that the metal oxide is reduced to produce metal particles on a surface of the metal oxide conducting layer 204 contacting with the metal layer 202, by controlling the concentration of the reducing gas and the plasma treatment time. As a result, the contact resistance between the two film layers is decreased and the conductivity is increased, thereby improving the display effect.

In practical use, the via hole 300 for conducting the metal layer 202 and the metal oxide conducting layer 204 is typically in the non-display area of a display panel. If a light leakage occurs at the position of the via hole 300, the display effect of the display area will be influenced. In the above step S104, after subjecting the metal oxide conducting layer 204 in the via hole 300 to a plasma treatment with a reducing gas, the reducing gas can reduce the metal in the metal oxide conducting layer 204, and a large number of metal particles formed will greatly reduce the transmittance of the metal oxide conducting layer 204 at the position. Thus, the metal particles produced by reduction can also serve to prevent a light leakage.

Figure 2:
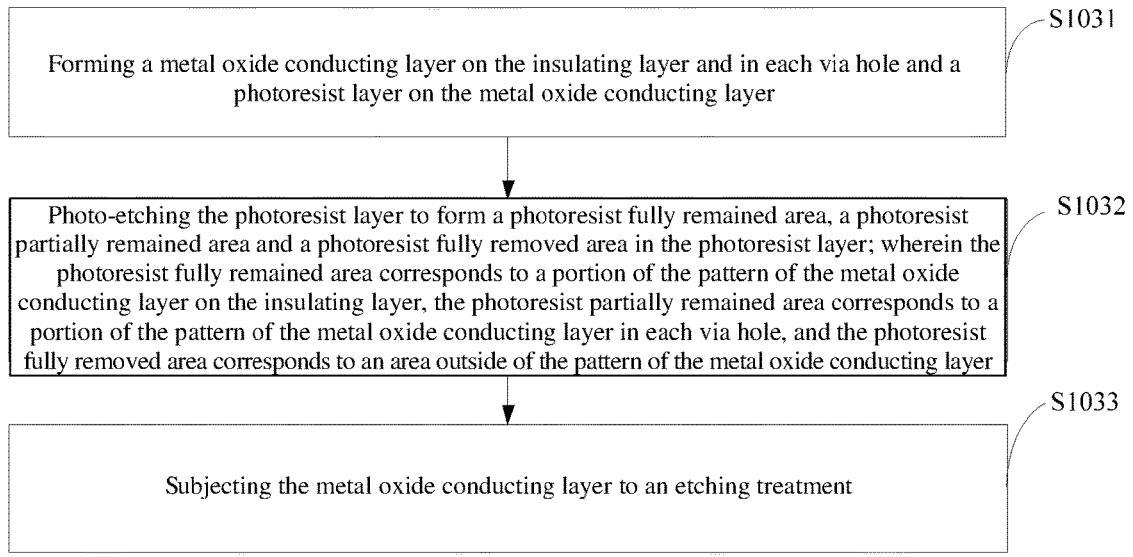
FIG. 2 shows a sub-flow chart of a manufacture method of a display substrate provided in an embodiment of the present disclosure.

Particularly, as shown in FIG. 2, in the manufacture method provided in the embodiments of the present disclosure, the above step S103 of forming the pattern of the metal oxide conducting layer on the insulating layer and in each via hole may comprise:

S1031: forming a metal oxide conducting layer on the insulating layer and in each via hole and a photoresist layer on the metal oxide conducting layer;

S1032: photo-etching the photoresist layer to form a photoresist fully remained area, a photoresist partially remained area and a photoresist fully removed area of the photoresist layer; wherein the photoresist fully remained area corresponds to a portion of the pattern of the metal oxide conducting layer on the insulating layer, the photoresist partially remained area corresponds to a portion of the pattern of the metal oxide conducting layer in each via hole, and the photoresist fully removed area corresponds to an area outside of the pattern of the metal oxide conducting layer; and S1033: subjecting the metal oxide conducting layer to an etching treatment.

In an optional embodiment, the above steps may particularly comprise:

S1031: forming a metal oxide conducting layer 204 on the insulating layer 203 and in each via hole 300 and a photoresist layer 205 on the metal oxide conducting layer 204, as shown in FIG. 4c; and S1032: photo-etching the photoresist layer 205 to form a photoresist fully remained area 301, a photoresist partially remained area 302 and a photoresist fully removed area 303 in the photoresist layer 205, as shown in FIG. 4d; wherein the photoresist fully remained area 301 corresponds to a portion of the pattern of the metal oxide conducting layer 204 on the insulating layer 203, the photoresist partially remained area 302 corresponds to a portion of the pattern of the metal oxide conducting layer 204 in each via hole 300, and the photoresist fully removed area 303 corresponds to an area outside of the pattern of the metal oxide conducting layer 204.

When etching the metal oxide conducting layer, the photoresist fully remained area 301 is used for manufacturing a portion of the pattern of the metal oxide conducting layer 204 on the insulating layer 203, and the photoresist partially remained area 302 is used for manufacturing a portion of the pattern of the metal oxide conducting layer 204 in each via hole 300.

More particularly, in the above step S1032, photo-etching the photoresist layer 205 may comprise:

photo-etching the photoresist layer 205 with a halftone mask plate or a gray tone mask plate.

In the embodiments of the present disclosure, the exposure degrees of the photoresist layer 205 at different positions are varied by exposing the photoresist layer 205 with a halftone mask plate or a gray tone mask plate. Thus, after developing the photoresist layer 205, the photoresist layer 205 has different thicknesses at different positions, such that the photoresist fully remained area 301, the photoresist partially remained area 302 and the photoresist fully removed area 303 in FIG. 4d are obtained.

S1033: subjecting the metal oxide conducting layer 204 to an etching treatment, as shown in FIG. 4e.

In the above step S1033, because the photoresist fully remained area 301 and the photoresist partially remained area 302 in the photoresist layer 205 serve to protect the metal oxide conducting layer 204 not required to be etched, in the etching process of step S1033, only the metal oxide conducting layer 204 in the photoresist fully removed area 303 can be etched off to obtain a structure shown in FIG. 4e.

Figure 3:
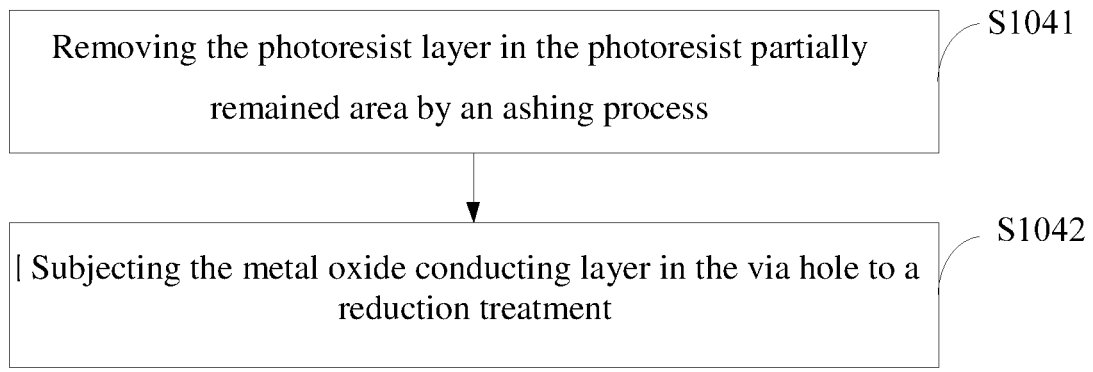
FIG. 3 shows another sub-flow chart of a manufacture method of a display substrate provided in an embodiment of the present disclosure.

In particular implementation, as shown in FIG. 3, in the manufacture method provided in the embodiments of the present disclosure, the above step S104 may comprise:

S1041: removing the photoresist layer in the photoresist partially remained area by an ashing process; and S1042: subjecting the metal oxide conducting layer in the via hole to a reduction treatment.

In an optional embodiment, the above steps may particularly comprise:

S1041: removing the photoresist layer 205 in the photoresist partially remained area 302 by an ashing process, as shown in FIG. 4f; and S1042: subjecting the metal oxide conducting layer 204 in the via hole 300 to a plasma treatment with a reducing gas, as shown in FIG. 4g.

Particularly, the above step S1041 may comprise:

producing a plasma through a plasma process with sulfur hexafluoride and oxygen as working gas and removing the photoresist layer 205 in the photoresist partially remained area 302 by an ashing process.

In practical use, in the above step S1041, when the photoresist layer 205 in the photoresist partially remained area 302 is removed by an ashing process, the photoresist in the photoresist fully remained area 301 will also be thinned. Thus, in the above step S1031, it is preferable to apply a relatively thick photoresist layer 205. The ashing process refers to etching off the photoresist as etching target. Because the ingredient of photoresist is typically an organic matter composed of elements of C, H, O, N and the like, the etching of the photoresist layer 205 can be achieved generally by reacting the photoresist layer 205 with an oxide to form volatile matters such as $CO$, $CO_2$, $H_2O$, $N_2$ or the like.

Particularly, the above step S1042 may comprise:

subjecting the metal oxide conducting layer 204 in the via hole 300 to a plasma treatment with one or more gases selected from the group consisting of hydrogen, chlorine, carbon monoxide, hydrogen sulfide, hydrogen bromide, methane, and sulfur dioxide.

Figure 4H:
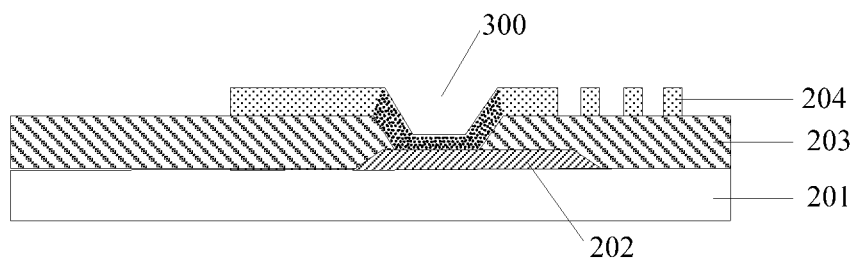

Referring to FIG. 4g, the photoresist fully remained area 301 of the photoresist layer 205 is used as a protecting layer, a plasma device is employed, and the above reducing gas is used as a working gas. Because the plasma of the reducing gas is highly reductive, the metal oxide in the via hole 300 area can be reduced to metal, thereby separating out metal particles in the metal oxide conducting layer 204. By controlling the concentration and treatment time of the reducing plasma, it can be controlled to separate out metal particles on a surface of the metal oxide conducting layer 204 close to the metal layer 202, so as to decrease the contact resistance at the contact interface. As shown in FIG. 4h, after the plasma treatment, the photoresist fully remained area 301 is removed to obtain a structure of the display substrate.

The above manufacture method of the display substrate provided in the embodiments of the present disclosure will be further illustrated in detail below with reference to FIG. 5, with the above metal oxide conducting layer 204 being a pixel electrode layer as an example.

Step S101 of forming a pattern of a metal layer on a base substrate and at least one insulating layer on the metal layer may comprise:

providing an array substrate comprising a display area (an area as indicated by A in FIG. 5a) and a non-display area (an area as indicated by B in FIG. 5a), wherein the display area comprises: a base substrate 201, a thin film transistor on the base substrate 201, an organic film layer 209 on the thin film transistor, a common electrode layer 210 on the organic film layer 209, and a passivating layer 211 on the common electrode layer 210; wherein the thin film transistor comprises: a gate electrode 206, a gate electrode insulating layer 207, an active layer 208 and source/drain metal layer 213 on the base substrate 201, wherein the source/drain metal layer 213 comprises a source electrode S and a drain electrode D, and in practical use, the source electrode S and the drain electrode D are exchangeable; and the non-display area comprises: the base substrate 201, the gate electrode insulating layer 207 on the base substrate 201, a data line 212 on the gate electrode insulating layer 207, and the passivating layer 211 on the data line 212.

Figure 5A:
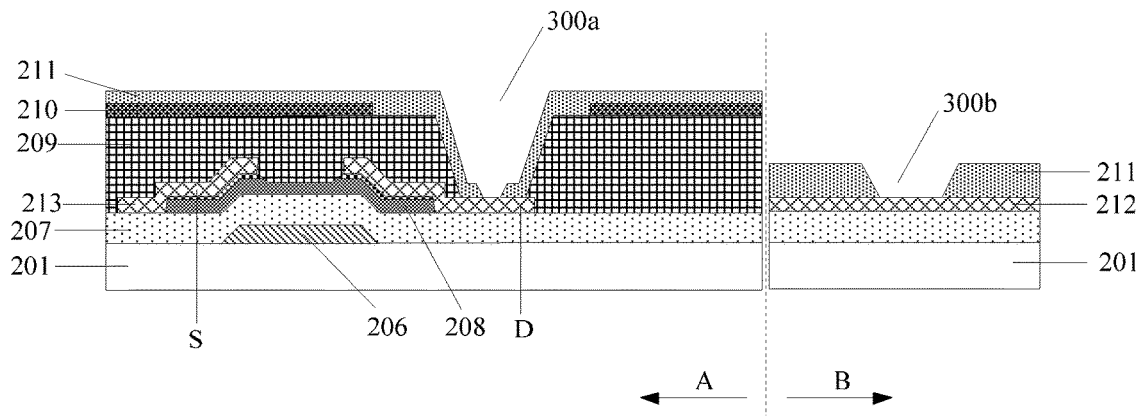
FIGS. 5a to 5g are other structural schematic diagrams for respective steps of a manufacture method of a display substrate in an embodiment of the present disclosure.

With reference to FIG. 5a, the source/drain metal layer 213 and the data line 212 may be disposed in the same layer, i.e., the source/drain metal layer 213 and the data line 212 may be formed by one patterning process. The film layer where the source/drain metal layer 213 and the data line 212 are disposed may be the above metal layer; and the organic film layer 209 and the passivating layer 211 in the display area as well as the passivating layer 211 in the non-display area may be the above insulating layer.

Step S102 of etching each insulating layer to form at least one via hole penetrating each insulating layer may comprise:

with reference to FIG. 5a as well, etching each insulating layer to form at least one via hole penetrating each insulating layer. Because an organic material or an inorganic material may be generally used for the insulating layer, if the materials of each insulating layer are similar with each other, one patterning process may be used to form all via holes. As shown in FIG. 5a, the via hole may comprise: a first via hole 300a in the display area and a second via hole 300b in the non-display area.

Figure 5B:
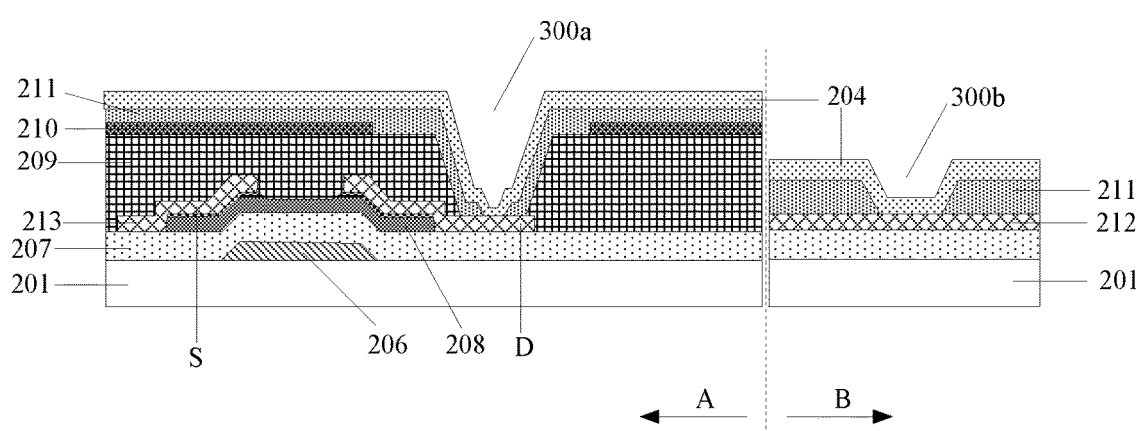

Step S103 of forming the pattern of the metal oxide conducting layer on the insulating layer, wherein the metal oxide conducting layer is electrically connected to the metal layer through each via hole, may comprise:

depositing on a top surface of the display substrate as shown in FIG. 5a, a transparent ITO film layer as the metal oxide conducting layer 204 by a magnetron sputtering process or other film forming manners, as shown in FIG. 5b. The ITO film layer is used as a pixel electrode layer, which is electrically connected to the drain electrode of the thin film transistor through the first via hole 300a in the display area, and is electrically connected to the data line 212 through the second via hole 300b in the non-display area.

Figure 5C:
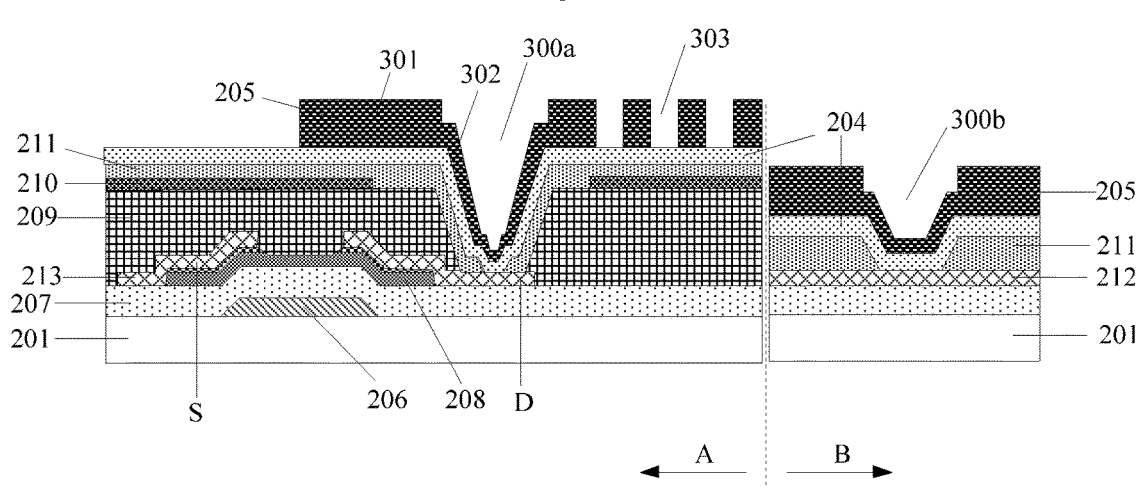

After forming the metal oxide conducting layer 204, a photoresist layer 205 is formed on the metal oxide conducting layer 204 by a coating process, then the photoresist layer 205 is exposed with a halftone mask plate or a gray tone mask plate and developed to form the photoresist fully remained area 301, the photoresist partially remained area 302 and the photoresist fully removed area 303, as shown in FIG. 5c.

Figure 5D:
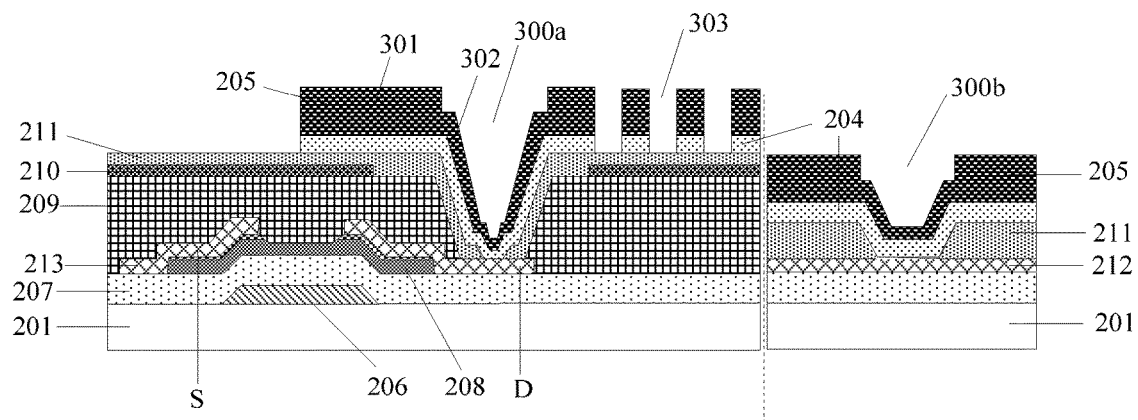

Using the photoresist layer 205 shown in FIG. 5c as an etching resistant layer, the metal oxide conducting layer 204 is etched by a wet etching process to obtain a pattern of the metal oxide conducting layer 204, i.e., to obtain each pixel electrode, as shown in FIG. 5d.

Figure 5E:
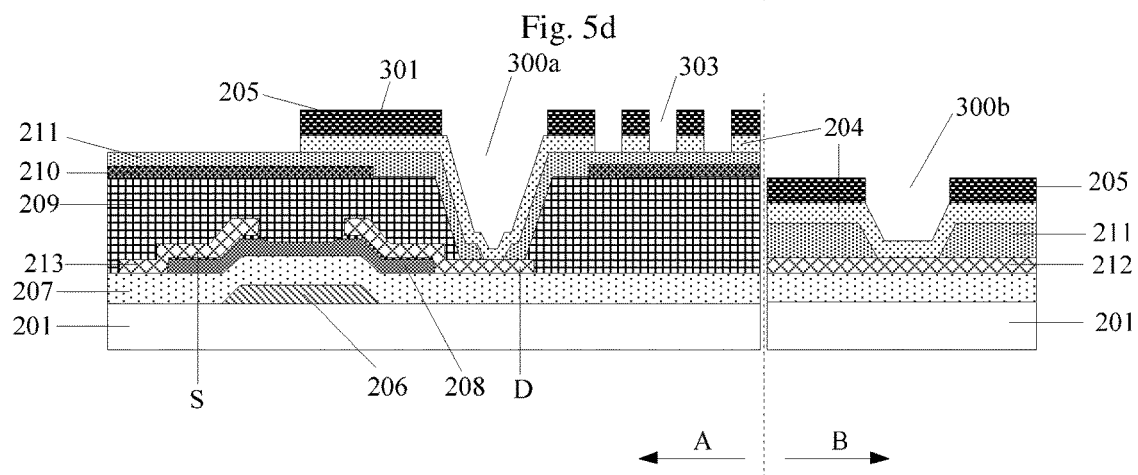

With reference to FIG. 5e, by treating the photoresist layer 205 through an ashing process using a plasma etching device with $SF_6/O_2$ as a working gas, the photoresist layer 205 corresponding to the photoresist partially remained area 302 is removed, while the photoresist fully remained area 301 is thinned.

Figure 5F:
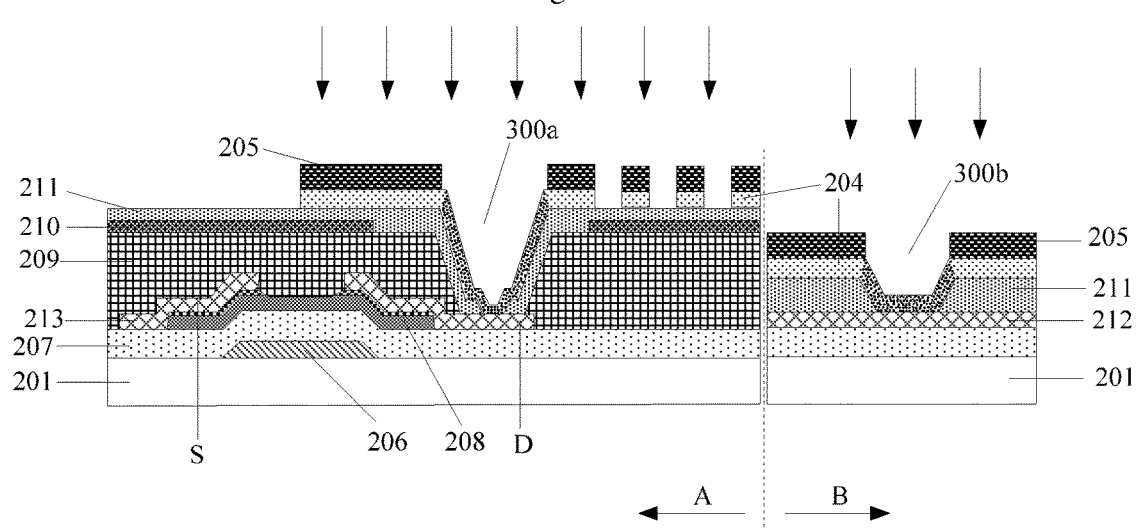

Step S104 of subjecting the metal oxide conducting layer in the via hole to a plasma treatment with a reducing gas such that the metal oxide conducting layer is reduced to produce metal particles at least on a surface of the metal oxide conducting layer contacting with the metal layer may comprise:

treating the metal oxide conducting layer 204 in the via hole 300 area with a reducing plasma, by using a plasma etching device (which may be the same device as that used in the ashing process) and a reducing working gas, such as one of hydrogen, chlorine, carbon monoxide, hydrogen sulfide, hydrogen bromide, methane, and sulfur dioxide, or a mixture thereof, with the photoresist fully remained area 301 being used as a protecting layer. Because the above reducing gas plasma is highly reductive, metal In in the pixel electrode ITO film layer in the via hole 300 area can be reduced, thereby separating out metal particles in the pixel electrode ITO film layer in the via hole 300 area. By controlling the concentration of the reducing gas plasma or treatment time, metal particles are also separated out on a side of the pixel electrode ITO film layer in the via hole 300 area close to the base substrate 201, as shown in FIG. 5f, as a result, the contact resistance between the pixel electrode and the drain electrode and the contact resistance between the pixel electrode and the data line 212 are decreased.

Figure 5G:
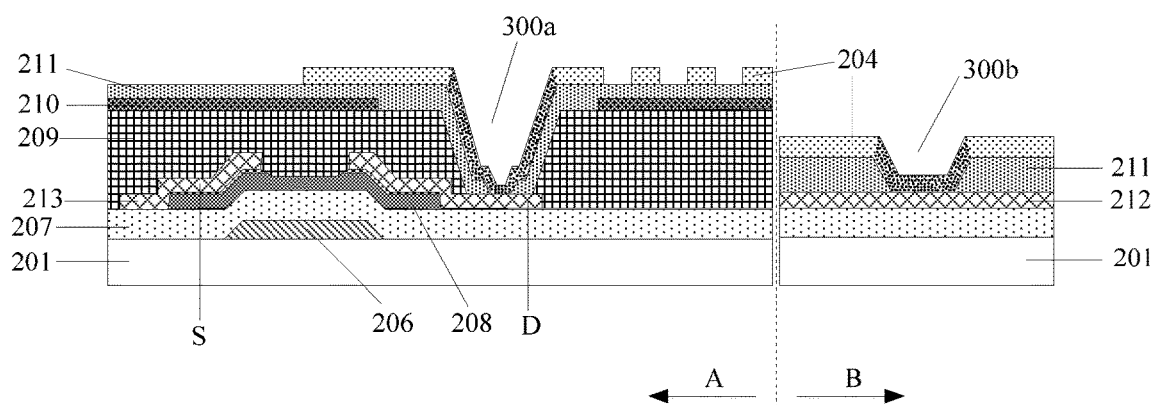

As shown in FIG. 5g, after completing the plasma treatment, the photoresist fully remained area 301 is removed to obtain a structure of the display substrate. Because the depth of the first via hole 300a in the display area is relatively large (about 1 μm to 5 μm), a light leakage is very easily to occur at the first via hole 300a due to uneven alignment or other factors, thereby influencing the display quality. In the embodiments of the present disclosure, because a large amount of metal particles are separated out in the pixel electrode ITO film layer in the via hole, and the dense metal particles will greatly reduce the transmittance of the pixel electrode ITO film layer in the first via hole 300a, as such, the manufacture method of a display substrate provided in the embodiments of the present disclosure can not only decrease the contact impedance between the pixel electrode and the drain electrode, but also alleviate the light leakage phenomena at the first via hole 300a, improving the performances of the liquid crystal display panel.

Based on the same concept, the embodiments of the present disclosure further provide a display substrate. Because the principle by which the display substrate solves problems is similar to that of the above-mentioned manufacture method of a display substrate, the implementation of the display substrate can refer to the above-mentioned manufacture method of a display substrate, and the repeating part will not be reiterated.

As shown in FIG. 4h, the display substrate provided in the embodiments of the present disclosure may comprise: a base substrate 201, and a metal layer 202, at least one insulating layer 203 and a metal oxide conducting layer 204 disposed respectively on the base substrate 201; wherein, each insulating layer 203 is disposed between the metal layer 202 and the metal oxide conducting layer 204;

the metal oxide conducting layer 204 is electrically connected to the metal layer 202 through at least one via hole 300 penetrating each insulating layer 203; and the metal oxide conducting layer 204 comprises metal particles produced by reducing the metal oxide conducting layer 204 and the metal particles are present at least on a surface of the metal oxide conducting layer 204 contacting with the metal layer 202.

In the above display substrate provided in the embodiments of the present disclosure, because the metal particles produced by reducing the metal oxide conducting layer 204 are present at least on a surface of the metal oxide conducting layer 204 contacting with the metal layer 202, on one hand, the contact resistance between the metal oxide conducting layer 204 and the metal layer 202 can be decreased and the conductivity can be increased, and on the other hand, the metal particles produced by reduction can reduce the transmittance of the metal oxide conducting layer 204 to alleviate the light leakage phenomena at the via hole 300, thereby improving the display effect.

In particular implementation, as shown in FIG. 5g, the above display substrate provided in the embodiments of the present disclosure may comprise: a display area (such as an area indicated by A in FIG. 5g) and a non-display area (such as an area indicated by B in FIG. 5g).

The display area comprises a plurality of thin film transistors; wherein the metal layer 202 comprises source electrode and drain electrode of each thin film transistor; the metal oxide conducting layer 204 comprises a plurality of pixel electrodes; and the via hole comprises a first via hole 300a for conducting each pixel electrode and corresponding drain electrode.

Further, the above metal layer 202 may further comprise: a plurality of data lines 212 in the non-display area; and the via hole may further comprise: a second via hole 300b for conducting each data line 212 and corresponding pixel electrode.

Each pixel electrode is connected to the drain electrode in the display area through the first via hole 300a, and connected to the data line 212 in the non-display area through the second via hole 300b.

Based on the same concept, the embodiments of the present disclosure further provide a display device comprising the above-mentioned display substrate. The display device may be applied in any product or component having a displaying function such as mobile phone, tablet computer, television, display, notebook, digital photo frame, navigator and the like. Because the principle by which the display device solves problems is similar to that of the above-mentioned display substrate, the implementation of the display device can refer to the above-mentioned display substrate, and the repeating part will not be reiterated.

In the display substrate, the manufacture method thereof and the display device provided in the embodiments of the present disclosure, by subjecting the metal oxide conducting layer in the via hole to a plasma treatment with a reducing gas such that the metal oxide conducting layer is reduced to produce metal particles on a surface of the metal oxide conducting layer contacting with the metal layer, on one hand, the contact resistance between the metal oxide conducting layer and the metal layer can be decreased and the conductivity can be increased, and on the other hand, the metal particles produced by reduction can reduce the transmittance of the metal oxide conducting layer to alleviate the light leakage phenomena at the via hole, thereby improving the display effect.

Obviously, modifications and variations on the present application can be made by those skilled in the art without departing from the spirit and scope of the present application. As such, if these modifications and variations fall within the scopes of the claims of the present application or equivalent technologies thereof, the present application is intended to encompass these modifications and variations.

What is claimed is:

1. A display substrate comprising:
a base substrate, and
a metal layer, at least one insulating layer and a metal oxide conducting layer respectively on the base substrate, wherein,
the at least one insulating layer is disposed between the metal layer and the metal oxide conducting layer and comprises at least one via hole penetrating it;
the metal oxide conducting layer covers the metal layer and the at least one via hole, and is electrically connected to the metal layer through the at least one via hole; and
only the metal oxide conducting layer in the at least one via hole comprises metal particles produced by reducing the metal oxide conducting layer.

2. The display substrate according to claim 1, wherein the metal particles are present at least on a surface of the metal oxide conducting layer contacting with the metal layer.

3. The display substrate according to claim 1, wherein the display substrate comprises:
   a display area, and
   a non-display area,
   wherein the display area comprises a plurality of thin film transistors.

4. The display substrate according to claim 3, wherein,
   the display area further comprises an organic film layer on the thin film transistors, a common electrode layer on the organic film layer, and a passivating layer on the common electrode layer; and
   the non-display area comprises a plurality of data lines and a passivating layer on the data lines.

5. A display substrate, comprising:
   a base substrate, and
   a metal layer, at least one insulating layer and a metal oxide conducting layer respectively on the base substrate, wherein,
   the at least one insulating layer is disposed between the metal layer and the metal oxide conducting layer and comprises at least one via hole penetrating it;
   the metal oxide conducting layer covers the metal layer and the at least one via hole, and is electrically connected to the metal layer through the at least one via hole; and
   the metal oxide conducting layer M the at least one via hole comprises metal particles produced by reducing the metal oxide conducting layer,
   wherein,
   the display substrate comprises a display area, and non-display area,
     wherein the display area comprising a plurality of thin film transistors, and further comprising an organic film layer on the thin film transistors, a common electrode layer on the organic film layer, and a passivating layer on the common electrode layer; and
   the non-display area comprises a plurality of data lines and a passivating layer on the data lines, and
   wherein,
   the metal layer comprises source/drain electrodes of each of the plurality of thin film transistors;
   the metal oxide conducting layer comprises a plurality of pixel electrodes;
   the insulating layer comprises the organic film layer and the passivating layer in the display area; and
   the at least one via hole comprises a first via hole for conducting each of the plurality of pixel electrodes and corresponding drain electrode.

6. The display substrate according to claim 5, wherein
   the metal layer further comprises the plurality of data lines;
   the insulating layer further comprises the passivating layer in the non-display area; and
   the at least one via hole further comprises a second via hole for conducting each of the plurality of data lines and corresponding pixel electrode.

7. A display device comprising the display substrate according to claim 1.

8. A display device comprising the display substrate according to claim 2.

9. A display device comprising the display substrate according to claim 3.

10. A display device comprising the display substrate according to claim 4.

11. A display device comprising the display substrate according to claim 5.

12. A display device comprising the display substrate according to claim 6.

\* \* \* \* \*